(12) United States Patent
Merkel et al.

(10) Patent No.: US 10,754,001 B2
(45) Date of Patent: Aug. 25, 2020

(54) MEASURING SYSTEM AND MEASURING METHOD USING POSITION AND/OR ORIENTATION SENSORS

(71) Applicant: Rohde & Schwarz GmbH & Co. KG, Munich (DE)

(72) Inventors: Sandra Merkel, Munich (DE); Uwe Bader, Ottobrunn (DE); Christoph Von Gagern, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1092 days.

(21) Appl. No.: 13/860,227

(22) Filed: Apr. 10, 2013

(65) Prior Publication Data

US 2014/0306843 A1 Oct. 16, 2014

(51) Int. Cl.
*G01S 13/14* (2006.01)
*G01S 3/14* (2006.01)
*G01R 29/10* (2006.01)

(52) U.S. Cl.
CPC ............... *G01S 3/14* (2013.01); *G01R 29/10* (2013.01)

(58) Field of Classification Search
CPC .......... G01S 3/14; G01R 29/10; G01R 29/08; H04B 17/10
USPC ........................................ 342/358, 385, 360
See application file for complete search history.

(56) References Cited

U.S. PATENT DOCUMENTS

| 8,160,831 | B1 | 4/2012 | Rausch et al. | |
|---|---|---|---|---|
| 9,151,693 | B1* | 10/2015 | Yang | H04M 1/24 |
| 2006/0281415 | A1* | 12/2006 | Koyanagi | H04W 24/04 |
| | | | | 455/67.11 |
| 2009/0284425 | A1* | 11/2009 | Snow | G01R 29/10 |
| | | | | 343/703 |
| 2011/0269418 | A1* | 11/2011 | Kangas | H04B 17/309 |
| | | | | 455/226.2 |
| 2014/0141726 | A1* | 5/2014 | Schlub | G01R 29/0857 |
| | | | | 455/67.12 |

FOREIGN PATENT DOCUMENTS

WO 2008/153639 A1 12/2008
WO 2012/085932 A2 6/2012

\* cited by examiner

*Primary Examiner* — Vladimir Magloire
*Assistant Examiner* — Helena H Seraydaryan
(74) *Attorney, Agent, or Firm* — Ditthavong & Steiner, P.C.

(57) ABSTRACT

A measuring system for determining a directional characteristic of a first signal is provided. The device under test comprises sensor means for determining its position and/or orientation. The measuring system comprises positioning means for positioning and/or orienting the device under test, and a measuring device. The position and/or orientation are transmitted by the device under test to the measuring device. The measuring device comprises antenna means for receiving or sending the first signal and processing means for processing the position and/or orientation information. The processing means determine the directional characteristic at least from the position and/or orientation.

9 Claims, 7 Drawing Sheets

US 10,754,001 B2

MEASURING SYSTEM AND MEASURING METHOD USING POSITION AND/OR ORIENTATION SENSORS

FIELD OF THE INVENTION

The invention relates to a measuring system and a measuring method for measuring a directional characteristic of a signal sent or received by a device under test. Moreover, the invention relates to a measuring system and measuring method for measuring parameters of a communication network. Especially, sensors integrated into a mobile phone are used in the measurements.

BACKGROUND OF THE INVENTION

For determining the directional characteristic of signals emitted by mobile devices, for example mobile phones, conventionally, the mobile phone is placed on a positioning element, which can turn the device under test in two dimensions. This positioning element is connected to a measuring device and is able to rotate automatically, controlled by the measuring device. A measuring system constructed this way is very complicated, since the device under test on the positioning element as well as the positioning element itself have to be able to be positioned very exactly and reproducibly.

Moreover, for measuring the parameters, for example the reception quality within a communication network, conventionally, drive tests are performed. A complicated measurement infrastructure is usually integrated into a test vehicle. This infrastructure includes measurement receivers and an external antenna connected to the vehicle. Moreover, this measurement setup includes additional sensors for determining the position and orientation of the test vehicle.

For example the U.S. Patent application US 2009/0284425 A1 shows a measuring system for determining a direction characteristic of a test station. The system shown there is disadvantageous, since a complex measuring infrastructure including a measuring rover including an antenna and position-sensors is used.

Accordingly, one object of the invention is to create measuring systems and measuring methods which are able to measure the direction characteristic of a device under test and the parameters of a communication network without requiring complicated and expensive hardware setups.

SUMMARY OF THE INVENTION

An inventive measuring system serves the purpose of measuring a directional characteristic of a first signal sent or received by a device under test comprising sensor means for determining its position and/or orientation. The device under test is set up for including the determined position and/or orientation within the first signal. Alternatively, the position and/or orientation are transmitted by the device under test separately. The measuring system comprises positioning means for positioning and/or orienting the device under test and a measuring device comprising antenna means for receiving the first signal or sending the first signal and processing means for processing the first signal sent by the device under test. The processing means comprise sensor processing means for determining the position and/or orientation included in the first signal or transmitted separately. The processing means are set up for determining the directional characteristic from the received first signal corresponding to the position and/or orientation or from a parameter determined by the device under test from the first signal received by the device under test and the position and/or orientation. It is therefore possible to determine the directional characteristic without the need for positioning means, which perform an accurate positioning and orientation.

In a first case, the first signal is sent by the device under test. In this case, the device under test includes the position/orientation information in the first signal or transmits it separately. The measuring device is then set up for receiving the first signal including the position/orientation information or the separately transmitted position/orientation information.

Alternatively, in a second case, the first signal is received by the device under test. In this case, the position/orientation information is transmitted by the device under test separately from the first signal to the measuring device. Moreover the device under test is then set up for generating the parameter from the received first signal in order for the measuring device to determine the directional characteristic.

The device under test is advantageously a mobile device, preferably a mobile telephone. The sensor means comprise sensors measuring the position and/or orientation like a satellite navigation-system sensor and/or a gyroscope and/or an accelerometer and/or a magnetometer and/or an altimeter. These sensors allow an accurate measurement of the position and/or orientation of the device under test.

The positioning means are advantageously set up for positioning and/or orienting the device under test manually. Moreover they are advantageously set up for passively positioning and/or orienting the device under test. This means that they merely hold the device under test in a position into which it is brought by a user. Moreover the positioning means are advantageously not connected to the measuring device. The positioning means are therefore constructed very simple.

Alternatively, the positioning means are set up for automatically orienting and/or positioning the device under test, e.g. by a rotating turntable. This leads to a higher hardware use, but to a lower user effort. Such a turntable could be used after manual positioning of the device to speed up the measurement of many positions and/or orientations. The advantage of the invention is that there doesn't need to be position feedback from the turntable to the measuring device and that the initial positioning and orientation of the device under test doesn't need to be done with high precision.

A second embodiment of the inventive measuring system for measuring parameters of a communication network comprises a mobile telephone comprising sensor means for determining a position and/or orientation of the mobile telephone, antenna means for receiving a signal from the communication network, and calculation means for determining the parameters of the communication network based upon the received signal and/or the position and/or orientation of the mobile telephone. It is therefore possible to determine the parameters of the network without a need for additional expensive positioning hardware. The position and/or orientation can be considered in the measurement analysis.

Advantageously, the mobile telephone comprises direction determination means that are set up for determining a direction of origin of the signal received from the communication network. The calculation means are then set up for determining the parameters based additionally on the determined direction. The parameters of the network can therefore be measured more accurately. For drive tests, the above-mentioned is only applicable for very strong line-of-sight components. In a multi-path scenario there is no single direction of origin identifiable. Nevertheless, for multi-path scenarios the drive test results can be combined with the position and/or orientation information to enhance the analysis. The comparability of measurement points with the same or a differentiating device orientation can be investigated. Moreover, at one measurement position several device orientations can be measured and the results can be compared. Further, a mobile device with a directional characteristic measured at a set of selected orientations may be used to determine the major angle of arrival of the receive signal. A determination of the direction of origin of the signal is merely an application example.

The calculation means are advantageously set up for determining the parameters based additionally on a pre-stored directional characteristic of the mobile telephone. The measurement accuracy is thereby further increased.

A first embodiment of the inventive measuring method serves the purpose of measuring a directional characteristic of a first signal sent or received by a device under test comprising sensor means for determining its position and/or orientation. The device under test is set up for including the determined position and/or orientation within the first signal or for transmitting the position and/or orientation separately or for processing the received first signal considering the sensor information within the device under test or forward an optionally pre-processed received first signal and its sensor information to external measuring means. The measuring method comprises the following steps:

- positioning and/or orienting the device under test,
- receiving or sending the first signal,
- processing the first signal, and
- optionally repeating the previous steps.

The position and/or orientation included in the first signal or communicated separately are determined. The directional characteristic is determined from the received first signal and the position and/or orientation of the device under test. Alternatively it is determined from a parameter determined by the device under test from the first signal received by the device under test and the position and/or orientation. It is therefore possible to determine the directional characteristic without the need for a positioning means, which perform an accurate positioning and orientation.

A second embodiment of the inventive measuring method serves the purpose of measuring parameters of a communication network and comprises the following steps:

- determining a position and/or orientation of a mobile device using sensor means comprised by the mobile device,
- receiving a signal from the communication network by the mobile device,
- determining the parameters of the communication network based upon the received signal and the position and/or orientation of the mobile device. It is therefore possible to determine the parameters of the network without a need for expensive measurement hardware.

DESCRIPTION OF THE DRAWINGS

The foregoing aspects and many of the attendant advantages of this invention will become more readily appreciated as the same become better understood by reference to the following detailed description when taken in conjunction with the accompanying drawings.

Figure 1:
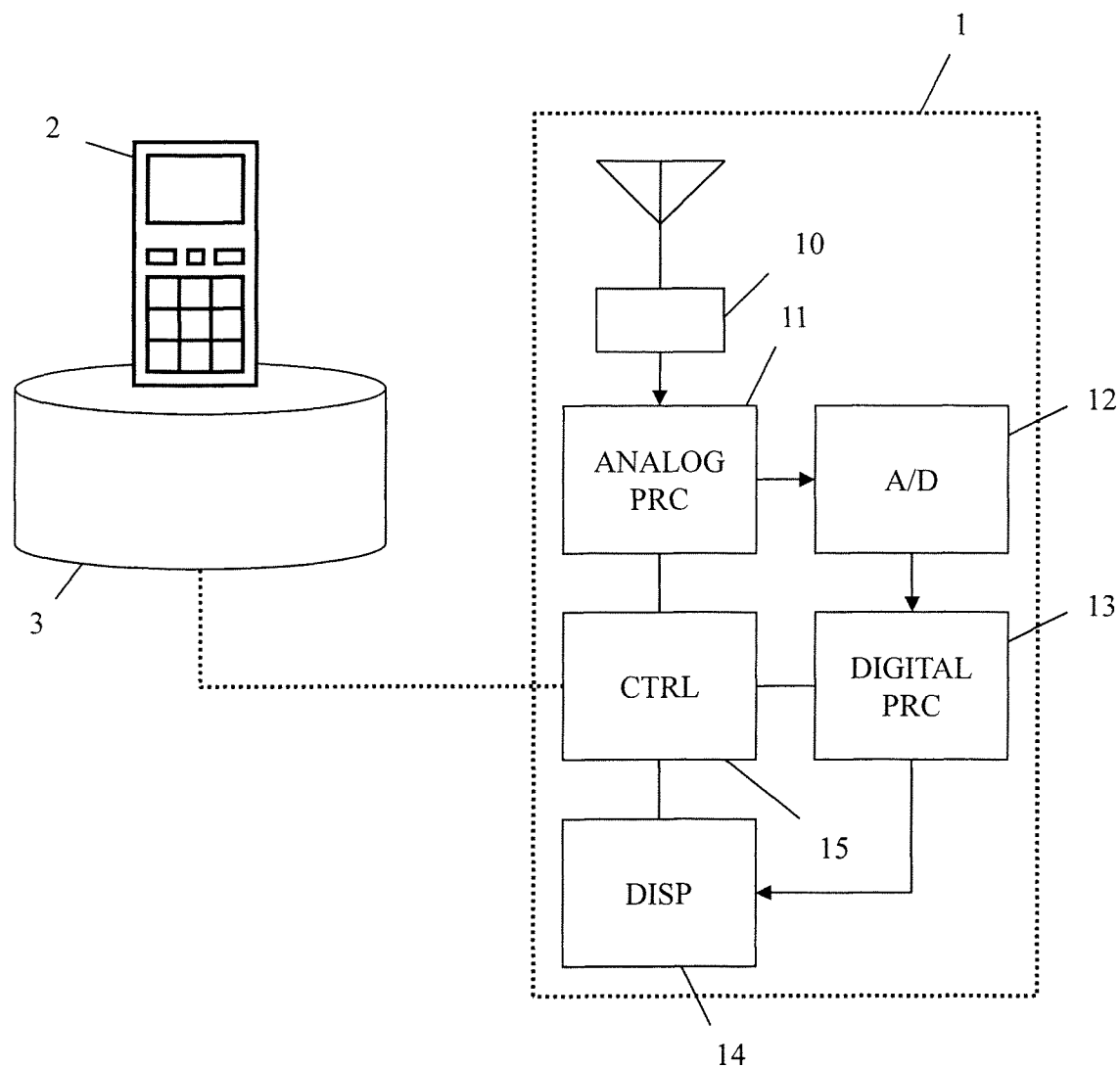
FIG. 1 shows a block diagram of a first embodiment of the inventive measuring system.

Corresponding reference characters indicate corresponding parts throughout the several views. Although the drawings represent embodiments of various features and components according to the present invention, the drawings are not necessarily to scale and certain features may be exaggerated in order to better illustrate and explain the present invention. The exemplification set out herein illustrates not to be construed as limiting the scope of the invention in any manner.

DETAILED DESCRIPTION OF EMBODIMENTS OF THE INVENTION

Figure 2:
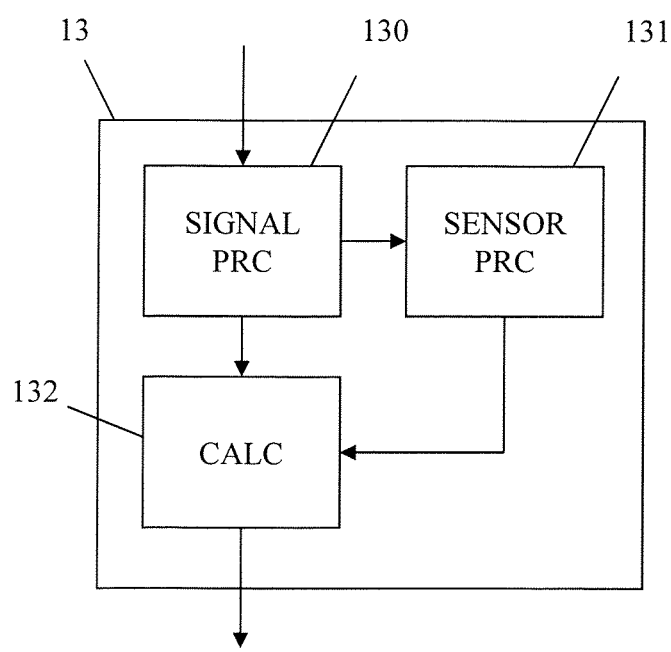
FIG. 2 shows a block diagram of a detail of the first embodiment of the inventive measuring system.

First we demonstrate the construction and function of a first embodiment of the inventive measuring system along FIG. 1-2. Secondly, along FIG. 3-5 the construction and function of a second embodiment of the inventive measuring system are shown. Finally two embodiments of the inventive measuring method are shown along FIG. 6-7. Similar entities and reference numbers in different figures have been partially emitted.

First Embodiment

FIG. 1 shows a first embodiment of the inventive measuring system. The measuring system comprises a measuring device 1 and positioning means 3. The positioning means 3 are set up for positioning and/or orienting the device under test 2 around at least one axis, preferably around two orthogonal axis and/or height. Moreover, the positioning means 3 are set up for being able to hold the device under test 2 in any orientation that can be configured around the axis.

The measuring device 1 comprises antenna means 10, connected to analog processing means 11. Moreover it comprises an analog-digital-converter 12, which is connected to the analog processing means 11. Furthermore the measuring device 1 comprises digital processing means 13, which are connected to the analog-digital-converter 12. Moreover, the measuring device 1 comprises display means 14, which are connected to the digital processing means 13. Furthermore, the measuring device 1 comprises control means 15, which are connected to the analog processing means 11, the digital processing means 13 and the display means 14. The control means 15 are set up for controlling the function of the connected elements.

When a measurement is to be performed, a user positions and/or orients the device under test 2 with the positioning means 3. The device under test 2 comprises sensors for determining its position and orientation. The device under test 2 determines its position and orientation using these sensor means. The device under test 2 transmits a signal comprising the information regarding its position and orientation. Alternatively, the position and orientation are not transmitted as part of the signal transmitted wirelessly, but are transmitted separately either wireless or wired. The signal is transmitted with a direction characteristic of the device under test 2, which is for example influenced by the antenna of the device under test 2. The signal is received e.g. by the antenna means 10 of the measuring device 1. The antenna means 10 performs a pre-processing, for example a pre-amplification.

The resulting signal is then passed on to the analog processing means 11, which perform analog processing, e.g. a power detection, a frequency reduction to the baseband, etc. A resulting analog signal is passed on to the analog-digital-converter 12, which digitizes the signal. The resulting digital signal is passed on to the digital processing means 13, which perform digital processing. For example, a demodulation and a decoding of the signal are performed. Especially, the digital processing means 13 read out the information regarding the position and/or orientation of the device under test 2, which was included into the signal transmitted by the device under test 2.

The digital processing means 13 furthermore aggregate the data collected. Therefore, for the current position and orientation of the device under test 2, the receive power or the signal quality or the signal-to-noise-ratio, is stored in a database not depicted here. The previously described process is repeated for a number of positions and/or orientations of the device under test 2 by changing the position and/or orientation using the positioning means 3 manually or automatically. It is important to note that a connection of the positioning means 3 to the measuring device 1 is not necessary, since the positioning means 3 can be operated entirely manually.

Alternatively, the positioning means 3 are operated by use of one or more motors, which are controlled by the control means 15 of the measuring device 1. In this case, the position and/or orientation information transmitted by the device under test are only used to check if the positioning device 3 operates correctly.

Optionally, after one measurement is completed, a new position is adjusted either manually or automatically. Then, a new measurement can be started. This process may be repeated until an end position is reached.

In an alternative embodiment, the measuring device is set up for sending out a signal using the antenna means 10. In this case, the signal is received by the device under test 2. The device under test is then set up for determining a parameter, e.g. a receive power or a signal-to-noise-ratio or a throughput for each position and/or orientation that is set by the positioning means 3. In this case, the position and/or orientation is either transmitted separately from the parameter determined from the first signal to the measuring device 1 or the measuring and processing is located within the device under test itself.

Regarding the internal function of the digital processing means 13, it is referred to FIG. 2. In FIG. 2 the construction of the digital processing means 13 of FIG. 1 is shown in detail. The digital processing means 13 comprise signal processing means 130, which are connected to sensor processing means 131 and calculation means 132. The sensor processing means 131 and the calculation means 132 are also connected to each other. The signal processing means 130 receives the digitized signal from the analog-digital-converter 12 of FIG. 1.

The signal processing means 130 performs for example a demodulation and a decoding of the digitized signal. The resulting data is passed on to the sensor processing means 131, which extract the information regarding orientation and position of the device under test 2 of FIG. 1. This position and orientation information is then passed on to the calculation means 132. Moreover, the data resulting from the signal processing means 130 is also passed on to the calculation means 132. The calculation means 132 are set up for determining the direction characteristic of the device under test 2 from the position and/or orientation information, from the data resulting from the signal processing means 130 and furthermore resulting from the information determined by the analog processing means 11 of FIG. 1, especially the receive power of the signal for each setting of the positioning means 3.

The resulting information is stored and/or passed on to the display means 14 of FIG. 1, which are set up for displaying the information as a direction characteristic. Alternatively, the direction characteristic is merely stored and/or transmitted to some other device.

Second Embodiment

Figure 3:
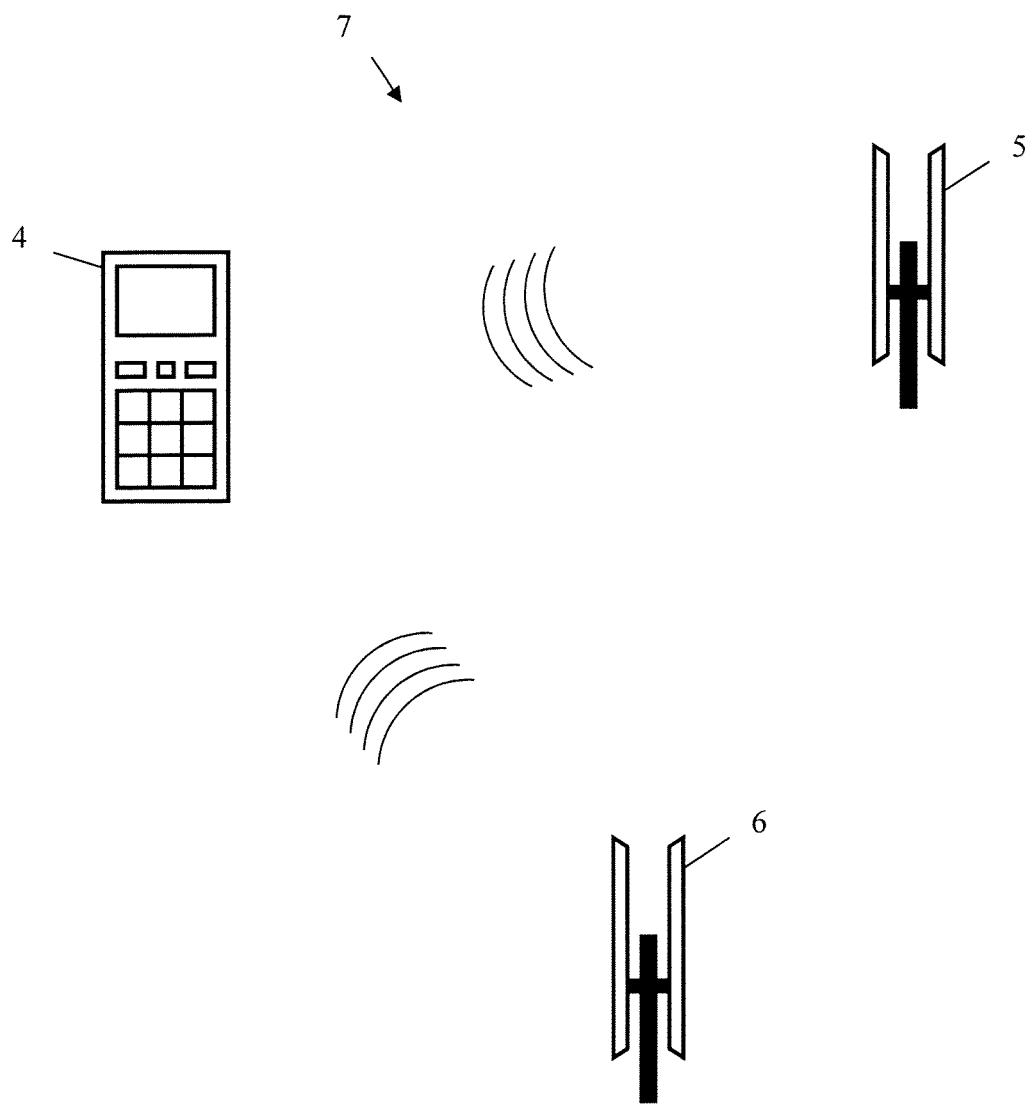
FIG. 3 shows a second embodiment of the inventive measuring system.

In FIG. 3, a second embodiment of the inventive measuring device is shown. In this case, the inventive measuring system comprises a mobile telephone 4 including sensors as part of the measuring system. The mobile telephone 4 receives signals of base stations 5, 6 of a communication network 7. Moreover, the mobile telephone 4 comprises sensor means for detecting its position and orientation. Regarding the function and the construction of the measuring system, it is referred to FIG. 4.

Figure 4:
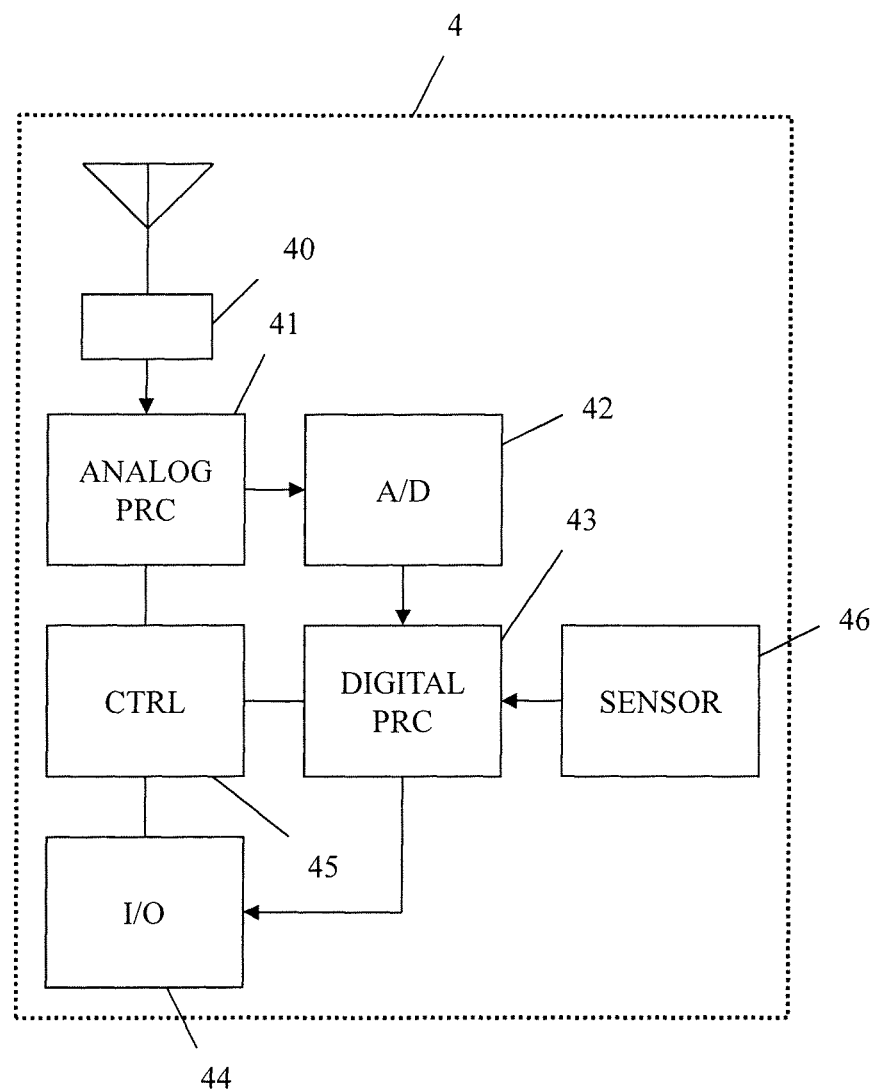
FIG. 4 shows a block diagram of a first detail of the second embodiment of the inventive measuring system.

In FIG. 4 the mobile telephone 4 of FIG. 3 is shown in detail. The mobile telephone 4 comprises antenna means 40 connected to analog processing means 41, which again are connected to an analog-digital-converter 42. Moreover, the analog-digital-converter 42 is connected to digital processing means 43, which are connected to input-output-means 44. Moreover, sensor means 46 are connected to the digital processing means 43. Moreover, the mobile telephone 4 comprises control means 45, which are connected to the analog processing means 41, the digital processing means 43 and the input-output-means 44. The control means 45 are set up for controlling the connected elements.

The mobile telephone 4 receives signals from the base stations 5, 6 of the communication network 7 of FIG. 3 using the antenna means 40. The antenna means 40 performs for example a pre-amplification. A resulting analog signal is passed on to the analog processing means 41, which perform analog processing, for example a power detection, a frequency reduction and/or a filtering. A resulting analog signal is passed on to the analog-digital-converter 42, which digitizes the signal and passes it on to the digital processing means 43. The digital processing means 43 perform digital processing on the digitized signal, e.g. a demodulation and a decoding of the signal are performed.

The sensor means 46 comprise sensors for detecting the position and/or orientation of the mobile telephone 4. This information is determined by the sensor means 46 and transmitted to the digital processing means 43. The digital processing means 43 calculate parameters of the communication network 7 of FIG. 3 based upon the position and/or orientation information and based upon the information determined by the analog processing means 41, for example the reception power and/or by the digital processing means 43, for example the signal-to-noise-ratio. The resulting parameters are stored and/or transmitted to input-output-means 44, which are set up for transmitting the information to another measuring device, when the present test drive is over. Regarding the function of the digital processing means 43, it is referred to FIG. 5.

Instead of a mobile telephone, a mobile device in general can be used. For example, also a laptop or a tablet pc can be used. It is merely important that the mobile device is able to receive signals from the communication network 7 and to determine its position and/or orientation.

Figure 5:
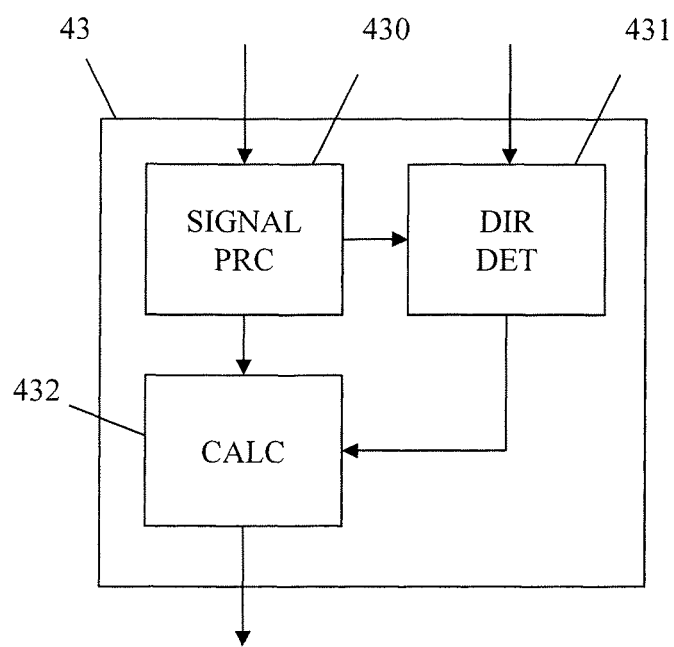
FIG. 5 shows a block diagram of a second detail of the second embodiment of the inventive measuring system.

In FIG. 5 the internal construction of the digital processing means 43 of FIG. 4 is shown. The digital processing means 43 comprise signal processing means 430, which are connected to direction determination means 431 and calculation means 432. The direction determination means 431 are furthermore also connected to the calculation means 432.

The digitized signal from the analog-digital-converter 42 is passed on to the signal processing means 430. The signal processing means 430 performs the above-described digital processing, for example the demodulation and the decoding. The resulting data is passed on to the calculation means 432.

The information regarding orientation and/or positioning of the mobile telephone 4 from the sensor means 46 of FIG. 4 are handed to the direction determination means 431. The direction determination means 431 determine a direction of origin of the incoming signals. Therefore, the different signals from different base stations 5, 6 of FIG. 3 are determined by the direction determination means 431. For doing so, the direction determination means 431 use information from the demodulated signal identifying the base stations 5, 6. The location of these base stations 5, 6 is determined from a database, in which the locations of all base stations are stored. From the present location and orientation of the mobile telephone 4 and the location information of the base stations 5, 6, the directions of the base station 5, 6 towards the mobile telephone 4 are calculated by the direction determination means 431. This direction information is passed on to the calculation means 432.

The calculation means 432 are set up for calculating a parameter of the communication network 7 based upon the present position and/or orientation of the mobile telephone 4, the direction of the origin of the received signals and based upon a known direction characteristic of the mobile telephone 4. Since the mobile telephone 4 has a direction characteristic, which is not omnidirectional, the received signal power or the received signal-to-noise-ratio or the reception quality has to be weighted with the direction characteristic in order to determine accurate values for the receive power and/or signal-to-noise-ratio or the reception quality of the communication network 7.

The resulting parameters of the communication network are then passed on to the input-output means 44 and stored or output to another device.

Third Embodiment

Figure 6:
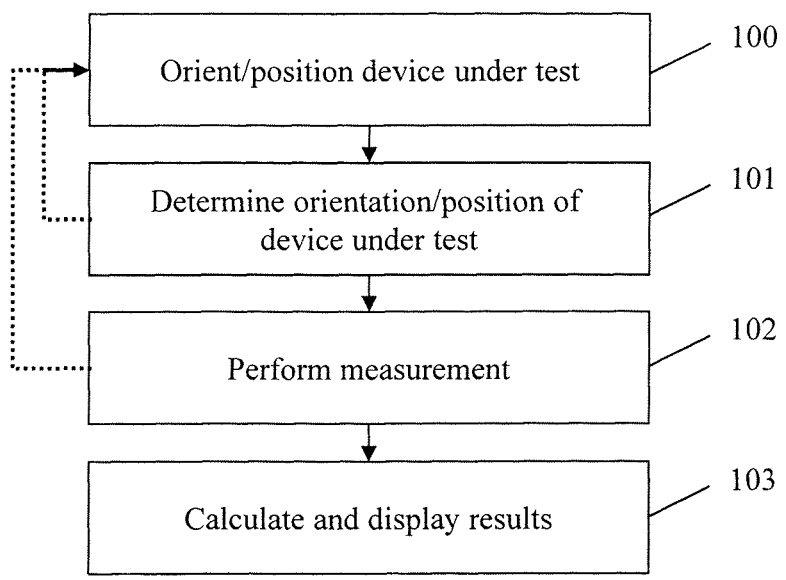
FIG. 6 shows a flowchart of a first embodiment of the inventive measuring method.

In FIG. 6, a first embodiment of the inventive measuring method is shown. This measuring method corresponds to the measuring system of FIG. 1-2. In a first step 100, a device under test, for example a mobile telephone is positioned and oriented. In a second step 101, the position and/or orientation of the device under test are determined by sensors present within the device under test. After determining the orientation and/or position of the device under test in step 101, optionally the step 100 can be repeated, if the present position and orientation are not satisfactory, for example if this position and/or orientation already have been measured.

In a third step 102, a signal generated by the device under test including the orientation and/or position of the device under test is measured. Optionally, the orientation and/or position is transmitted separately. The orientation and/or position of the device under test is extracted. Moreover, after performing the measurement in step 102, the steps 100 and 101 can be repeated for a number of further orientations and/or positions of the device under test. Alternatively, the device under test measures a signal generated by a measuring device and determines a parameter from it, which—in combination with the sensor data from the device under test—allows the determination of the directional characteristic. The parameter could be for example a throughput, a receive power or a signal-to-noise-ratio.

As soon as all positions and/or orientations have been measured, a directional characteristic is calculated and displayed in a fourth step 103. Regarding the function it is furthermore referred to FIG. 1.

Fourth Embodiment

Figure 7:
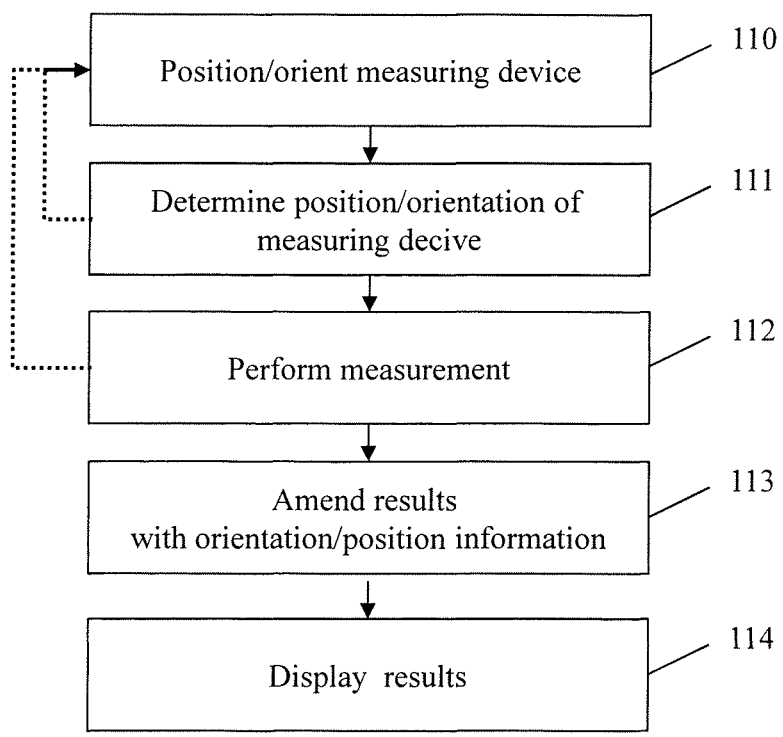
FIG. 7 shows a flowchart of a second embodiment of the inventive measuring system.

In FIG. 7, a second embodiment of the inventive measuring method is shown. This method corresponds to the inventive measuring system according to FIG. 3-5. In a first step 110, a measuring device, for example a mobile telephone is positioned and oriented within a communication network. In a second step 111 the position and/or orientation of the measuring device is determined by the measuring device. Optionally, if the determined position and/or orientation are not satisfactory, the first step 110 is repeated. In case the position/or orientation are satisfactory, a measurement of signals within the communication network is performed in a third step 112. For example, the receive power and/or the signal-to-noise-ratio and/or the reception quality and/or the throughput of received signals is determined. Optionally, the steps 110-112 are repeated for a number of different positions and/or orientations of the measuring device within the communication network.

In a fourth step 113, the measuring results are amended based upon the orientation and/or position information detected by the measuring device. Since the measuring device comprises a directional characteristic, as explained above, signals from different directions are registered differently. Since the directional characteristic of the measuring device is known, this is compensated or saved as additional information in case of multi-path scenarios. In a fifth step 114, the amended results, which are compensated for the directional characteristic of the measuring device are displayed or output.

While this invention has been described as having an exemplary design, the present invention may be further modified within the spirit and scope of this disclosure. This application is therefore intended to cover any variations, uses or adaptations of the invention using its general principles. Further, this application is intended to cover such departures from the present disclosure as come within known or customary practice in the art to which this invention pertains.

We claim:

1. A measuring system for determining a directional characteristic of a first signal sent by a device under test,
    wherein the device under test comprises sensor means,
    wherein the device under test is configured to include an orientation within the first signal or for transmitting position and/or orientation separately from the first signal in a wireless or wired manner,
    wherein the measuring system comprises:
        positioning means for orienting the device under test,
        a measuring device comprising
            antenna means for receiving the first signal,
            processing means for processing the received first signal and/or the separately transmitted orientation, wherein the processing means comprise sensor information processing means for determining the orientation of the device under test relative to the positioning means included in the first signal or transmitted separately, wherein the processing means are configured to determine the directional characteristic from the received first signal and the orientation, wherein a number of the positions and/or orientations of the device under test is determined, which in combination with sensor information data from the sensor means is used to test a multipath scenario, wherein the device under test is a mobile device, the sensor means comprise one or more sensors measuring the orientation, and wherein the sensor means comprises a gyroscope and/or an accelerometer and/or a magnetometer.

2. The measuring system according to claim 1, wherein the sensors are a satellite navigation system sensor and/or an altimeter.

3. The measuring system according to claim 1, wherein the positioning means are set up for orienting the device under test manually, and/or the positioning means are set up for passively positioning and/or orienting the device under test, and/or the positioning means are not connected to the measuring device.

4. The measuring system according to claim 1, wherein the measuring system is set up for measuring receive power and/or data throughput and/or reception quality and/or a signal strength of the first signal.

5. A measuring method for measuring a directional characteristic of a first signal sent by a device under test, wherein the device under test comprises sensor means, wherein the device under test is configured to include an orientation relative to positioning means within the sent first signal or for transmitting the orientation separately in a wireless or wired manner, wherein the measuring method comprises the following steps:

orienting the device under test, sending the first signal by the device under test, processing the first signal, wherein the orientation included in the first signal or transmitted separately are determined, and wherein the directional characteristic is determined from the received first signal and the position and/or orientation, wherein a number of the positions and/or orientations of the device under test is determined, which in combination with sensor information data from the sensor means is used to test a multipath scenario, wherein the device under test is a mobile device, the sensor means comprise one or more sensors, and wherein the sensor means comprises a gyroscope and/or an accelerometer and/or a magnetometer.

6. The measuring method according to claim 5, wherein the sensors are a satellite navigation system sensor and/or an altimeter.

7. The measuring method according to claim 5, wherein the device under test is oriented manually, and/or the device under test is oriented passively.

8. A measuring system for determining a directional characteristic of a first signal received by a device under test, wherein the device under test comprises sensor means for determining orientation of the device under test relative to positioning means, wherein the device under test is configured to transmit an orientation separately from the first signal in a wireless or wired manner, wherein the measuring system comprises:

the positioning means for orienting the device under test, a measuring device comprising
antenna means for receiving the first signal,
processing means for processing the separately transmitted orientation, wherein the processing means comprise sensor information processing means for determining the orientation transmitted separately, wherein the processing means are configured to determine the directional characteristic from a parameter determined by the device under test from the first signal received by the device under test and orientation, wherein a number of positions and/or orientations of the device under test is determined, which in combination with sensor information data is used to test a multipath scenario, wherein the device under test is a mobile device, the sensor means comprise one or more sensors measuring the orientation, and wherein the sensor means comprises a gyroscope and/or an accelerometer and/or a magnetometer.

9. A measuring method for measuring a directional characteristic of a first signal received by a device under test, wherein the device under test comprises sensor means for determining orientation of the device under test relative to positioning means, wherein the device under test is configured to transmit the orientation separately in a wireless or wired manner, wherein the measuring method comprises the following steps:

orienting the device under test, receiving the first signal by the device under test, processing the first signal, wherein the orientation transmitted separately are determined, and wherein the directional characteristic is determined from a parameter determined by the device under test from the first signal received by the device under test and the orientation, wherein a number of position and/or orientations of the device under test is determined, which in combination with sensor information data from sensor means is used to test a multipath scenario, wherein the device under test is a mobile device, the sensor means comprise one or more sensors, and wherein the sensor means comprises a gyroscope and/or an accelerometer and/or a magnetometer.

* * * * *